United States Patent
Williams et al.

(10) Patent No.: US 9,262,563 B2
(45) Date of Patent: Feb. 16, 2016

(54) METHODS AND SYSTEMS OF MODELING HYDROCARBON FLOW FROM KEROGENS IN A HYDROCARBON BEARING FORMATION

(75) Inventors: Kenneth E. Williams, Houston, TX (US); Sheldon B. Gorell, Katy, TX (US); Amit Kumar, Houston, TX (US); Ronald G. Dusterhoft, Katy, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 13/883,805

(22) PCT Filed: Oct. 26, 2011

(86) PCT No.: PCT/US2011/057898
§ 371 (c)(1),
(2), (4) Date: May 7, 2013

(87) PCT Pub. No.: WO2013/062541
PCT Pub. Date: May 2, 2013

(65) Prior Publication Data
US 2013/0231908 A1 Sep. 5, 2013

(51) Int. Cl.
*G06G 7/48* (2006.01)
*G06F 17/50* (2006.01)
*E21B 43/17* (2006.01)
*E21B 44/00* (2006.01)

(52) U.S. Cl.
CPC ............ *G06F 17/5009* (2013.01); *E21B 43/17* (2013.01); *E21B 44/00* (2013.01)

(58) Field of Classification Search
CPC ...................................................... E21B 43/17
USPC ............................................................. 703/10
See application file for complete search history.

(56) References Cited

U.S. PATENT DOCUMENTS

| 7,615,741 | B2 | 11/2009 | Jacobi et al. |
| 2003/0070480 | A1 | 4/2003 | Herron et al. |
| 2003/0178191 | A1 | 9/2003 | Maher et al. |
| 2006/0005968 | A1 | 1/2006 | Vinegar et al. |
| 2007/0259183 | A1 | 11/2007 | Knobloch |
| 2010/0228485 | A1 | 9/2010 | Betancourt et al. |
| 2010/0250215 | A1 | 9/2010 | Kennon et al. |

FOREIGN PATENT DOCUMENTS

WO  2012-030426 A1  3/2012

OTHER PUBLICATIONS

Abdallah et al.; Fundamentals of Wettability; Oilfield Review; pp. 44-61; 2007.*
Ticora Geosciences: Final Report Reservoir Property Analysis (report); 2005; 112 pages.*

(Continued)

*Primary Examiner* — Hugh Jones

(57) ABSTRACT

Modeling hydrocarbon flow from kerogens in a hydrocarbon bearing formation. At least some of the illustrative embodiments are methods including modeling flow of hydrocarbons through a hydrocarbon bearing formation by: obtaining an indication of kerogen-wet porosity of kerogen within a portion of the formation; obtaining an indication of water-wet porosity within the portion of the formation; modeling hydrocarbon movement through the kerogen-wet porosity; and modeling hydrocarbon movement through the water-wet porosity.

21 Claims, 6 Drawing Sheets

(56) References Cited

OTHER PUBLICATIONS

Bai et al.; Multiporosity/Multipermeability Approach to the simulation of Naturally Fractured Reservoirs; Water Resources Research. vol. 29. No. 6; 1993; pp. 1621-1633.*

Passey et al.; From Oil-Prone Source Rock to Gas-Producing Shale Reservoir—Geologic and Petrophysical Characterization of Unconventional Shale-Gas Reservoirs, SPE 131350; Jun. 2010; pp. 1-29.*

Lewis et al.; New Evaluation Techniques for Gas Shale Reservoirs; Reservoir Symposium 2004; pp. 1-11.*

Leythaeuser et al.; Pressure solution in carbonate source rocks and its control on petroleum generation and migration; Marine and Petroleum Geology, vol. 12, No. 7, 1995; pp. 717-733.*

Carcione et al.; Rock Physics of Geopressure and Prediction of Abnormal Pore Fluid Pressures Using Seismic Data; CSEG Recorder Sep. 2002; pp. 8-32.*

Buller et al.; Petrophysical Evaluation for Enhancing Hydraulic Stimulation in Horizontal Shale Gas Wells; SPE 132990; Sep. 2010; pp. 1-21.*

Olarewaju et al.; New Pressure-Transient Analysis Model for Dual-Porosity Reservoirs; SPE Formation Evaluation, SPE 15634; Sep. 1989; pp. 384-390.*

Acharya et al.; Organic Richness and Productivity Index Relationship in Dual Porosity Flow-System of Gas and Condensate Kerogen Reservoirs of Najmah Formation, North Kuwait; SPE 121811; 2009; pp. 1-9.*

Buckles et al.: Toward Improved Prediction of Reservoir Flow Performance: simulating oil and water flows at the pore scale Los Alamos Science No. 22 1994; pp. 112-121.*

Barenblatt et al. "Basic Concepts in the Theory of Seepage of Homogeneous Liquids in Fissured Rocks (Strata)," PPM (1960) 24(5) 1286-1303.*

Choi et al.: A new dual-porosity/dual-permeability model with non-Darcian flow through fractures; Journal of Petroleum Science and Engineering 17 (1997) 331-344.*

Milner et al.: Imaging Texture and Porosity in Mudstones and Shales: Comparison of Secondary and Ion-Milled Backscatter SEM Methods; CSUG/SPE 138975; Oct. 19, 2010; pp. 1-10.*

Warren and Root: The behavior of naturally fractured reservoirs. Society of Petroleum Engineers Journal, 3 (3), 1963; pp. 245-255.*

Kucuk et al.; Transient Flow in Naturally Fractured Reservoirs and Its Application to Devonian Gas Shales; SPE 9397; 55th Annual Fall AIM E; 1980; pp. 1-11.*

Padua: Nonisothermal Gravitational Composition Variation in a Large Deep-water Field; (SPE 56407; 1999; pp. 109-117.*

Sondergeld et al.: Petrophysical Considerations in Evaluating and Producing Shale Gas Resources; SPE 131768; Feb. 2010; pp. 1-34.*

Dixit et al.: Empirical Measures of Wettability in Porous Media and the Relationship between Them Derived From Pore-Scale Modelling; Transport in Porous Media 40: 2000; pp. 27-54.*

Leythaeuser et al. On the Primary Migration of Petroleum. World Petroleum Congress; 1987; pp. 227-236.*

Mann et al. (including Leythaeuser): Petroleum Migration: Mechanisms, Pathways, Efficiencies and Numerical Simulations; in Petroleum and Basin Evolution; Springer-Verlag Berlin Heidelberg 1997; pp. 403-520.*

International Search Report and Written Opinion issued Nov. 30, 2012 in International Patent Application No. PCT/US2012/034063, filed Apr. 18, 2012, 9 pages.

Modica, C.J. et al. Estimation of Kerogen Porosity in Source Rocks as a Function of Thermal Transformation: Example from the Mowry Shale in the Powder River Basin of Wyoming. AAPG Bulletin, Jan. 2012. vol. 96, No. 1, p. 87-108.

Ambrose, R.J. et al. New Pore-Scale Considerations for Shale Gas in Place Calculations. SPE 131772. Society of Petroleum Engineers. SPE Unconventional Gas Conference; Pittsburgh, Pennsylvania; Feb. 23-25, 2010, 17 pages.

Curtis, M.E. et al. Investigation of the Relationship Between Organic Porosity and Thermal Maturity in the Marcellus Shale. SPE 144370. Society of Petroleum Engineers. SPE North American Unconventional Gas Conference and Exhibition; The Woodlands, Texas; Jun. 14-16, 2011, 4 pages.

Pepper, A.S. et al. Simple Kinetic Models of Petroleum Formation. Part III: Modelling an Open System. Marine and Petroleum Geology; vol. 12, No. 4; pp. 417-452. 1995.

Shanley, K.W. Factors Controlling Prolific Gas Production from Low-Permeability Sandstone Reservoirs: Implications for Resource Assessment, Prospect Development, and Risk Analysis. The American Association of Petroleum Geologists. AAPG Bulletin; vol. 88, No. 8; pp. 1083-1112. Aug. 2004.

International Search Report and Written Opinion issued May 30, 2012 in International Patent Application No. PCT/US2011/057898, filed Oct. 26, 2011, 7 pages.

Bowker, K.A. Recent Developments of the Barnett Shale Play, Fort Worth Basin. West Texas Geological Society Bulletin. vol. 42, No. 6, p. 4-11. 2003.

Loucks, R.G. et al. Morphology, Genesis, and Distribution of Nanometer-Scale Pores in Siliceous Mudstones of the Mississippian Barnett Shale. Journal of Sedimentary Research. vol. 79, p. 848-861. 2009.

Loucks, R.G. et al. Preliminary Classification of Matrix Pores in Mudrocks. Gulf Coast Association of Geological Societies Transactions. vol. 60, p. 435-441. 2010.

* cited by examiner

METHODS AND SYSTEMS OF MODELING HYDROCARBON FLOW FROM KEROGENS IN A HYDROCARBON BEARING FORMATION

CROSS-REFERENCE TO RELATED APPLICATIONS

None.

BACKGROUND

Advances in directional drilling (i.e., horizontal drilling) along with advances in hydraulic fracturing have made economical the production of oil and gas from shale formations. For future planning purposes, companies involved in oil and gas production need estimates of future production from such shale formations. In an attempt to provide such estimates of future production, the oil and gas industry has attempted use formation modeling tools originally designed for conventional reservoirs (with high permeability). However, shale formations are vastly different than conventional reservoirs. For example, some shale formations may have 500 times less porosity than conventional reservoirs.

While it is possible to have existing formation modeling tools tuned to actual production history from a shale formation, the formation models are highly inaccurate as to future production from the shale formations.

Any advance which makes modeling of future hydrocarbon production from shale formations more accurate would provide a competitive advantage.

BRIEF DESCRIPTION OF THE DRAWINGS

For a detailed description of exemplary embodiments, reference will now be made to the accompanying drawings in which.

NOTATION AND NOMENCLATURE

Figure 1:
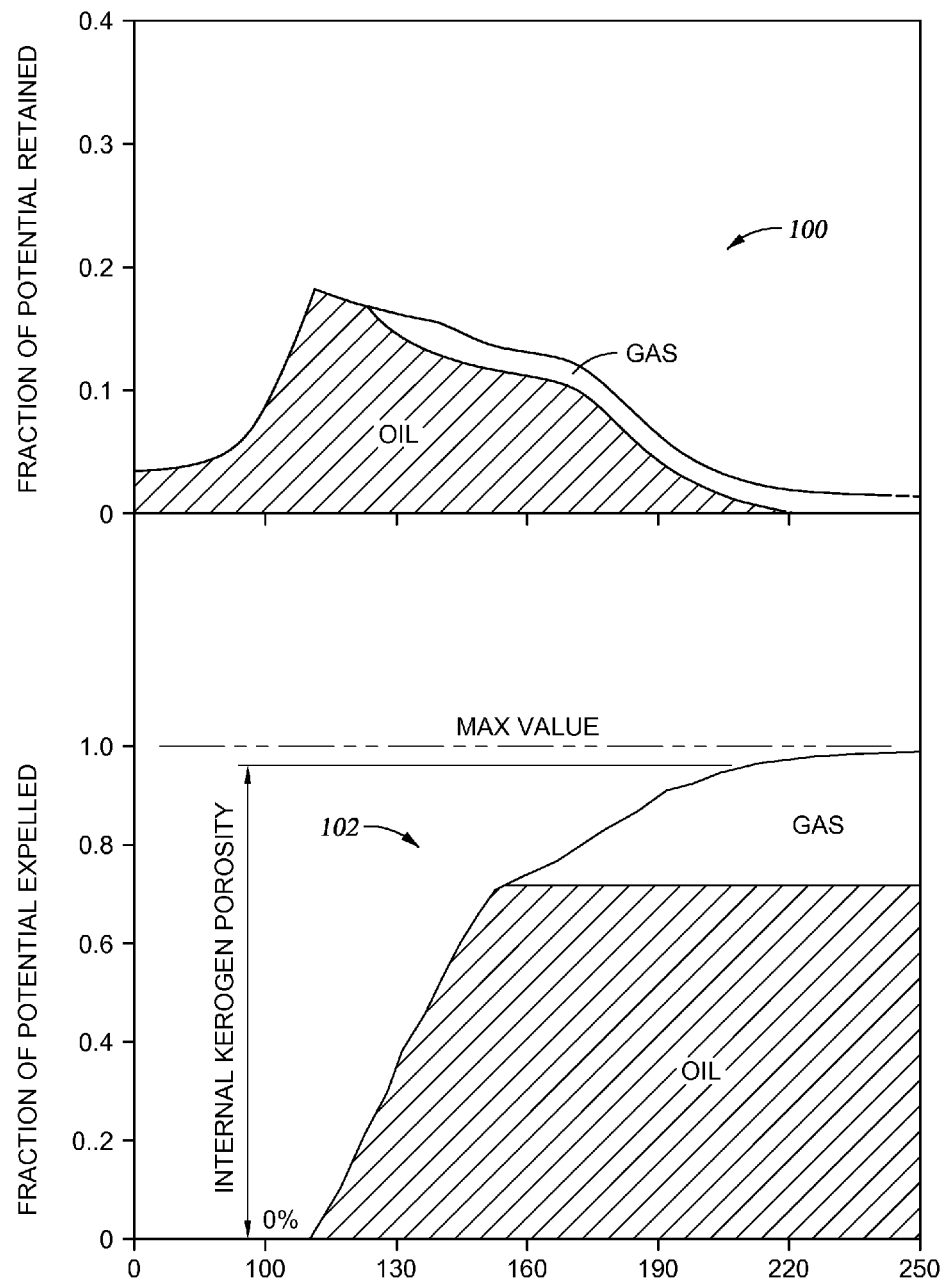
FIG. 1 shows graphs of expulsion and retention of hydrocarbons from a shale formation having a particular kerogen type, in order to explain calculating porosity of the kerogen in accordance with at least some embodiments.

Certain terms are used throughout the following description and claims to refer to particular components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Kerogen-wet porosity" shall mean an indication of present-day porosity whose presence is attributed to carbon material deposited with the clay and other minerals. "Kerogen-wet porosity" shall not speak to the affinity for hydrocarbons of the rock of formation.

"Water-wet porosity" shall mean an indication of present-day porosity whose presence is attributed to water initially deposited with the sediment of the formation, but which water may not now be present. "Water-wet porosity" shall not speak to the affinity for water of the rock of formation.

"Fracture porosity" shall mean a pore spaces caused by stress fractures in the formation. The stress fractures may be caused by natural stress (such as by compaction, faulting, uplifting) as well as induced stress (such as by fracturing operations associated with a borehole).

"Present-day porosity" shall mean a naturally occurring porosity as the porosity has existed for at least the last ten years.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The various embodiments are directed to systems and related methods of increasing the accuracy of modeling with respect to hydrocarbon production from shale formations. More particularly, various embodiments are directed to obtaining and applying indications of kerogen-wet porosity and water-wet porosity in formulating parameters with which to run simulations to predict future hydrocarbon production. In some cases, the simulations use the kerogen-wet porosity and water-wet porosity directly. In other cases, the kerogen-wet porosity and water-wet porosity are used to set or tune parameters for other formation modeling software tools. The specification first turns to a description of shale formations, and creation of the various porosities in shale formations.

Shale formations are sedimentary rock created by the deposition of mud comprising organic material, flakes of clay, and other minerals, such as quartz and calcite. Hydrocarbons are created within a shale formation based thousands of years of increased pressure and increased temperature associated with deep burial history. Due in part to the deposition mechanism and in part to the deposited materials, present day porosity and permeability of shale is very low. For example, the number and size of interstitial spaces between grains of deposited minerals in shale, as well as the connectivity of such interstitial spaces (i.e., permeability), is very low compared to, for example, a sandstone. Moreover, shale formations have high kerogen content (again compared to, for example, sandstone), and thus the oil and gas production mechanisms differ from conventional reservoirs.

In spite of having very low porosity and permeability, shale formations do have porosity and permeability. The overall porosity may comprise at least four different components: intergranular porosity; interstitial porosity; water-wet porosity; and kerogen-wet porosity. The primary interest of this specification is the kerogen-wet porosity and the water-wet porosity. Each will be discussed in turn.

Kerogen-Wet Porosity

Kerogen-wet porosity refers to pore spaces within the kerogen grains. The pore spaces within the kerogen grains are not present at deposition of the organic material. Rather, the pore spaces in the kerogen grains are created over geologic time by subsistence, burial, and resultant heating. The pressure and temperature causes the solid organic matter to convert to liquid and gas hydrocarbon components. The conversion to liquid and gas hydrocarbon components creates a volume increase, which thus causes microscopic fractures and expulsion of some of the oil and gas generated. Thus, "kerogen-wet" in this context refers to the creation mechanism of the porosity, not the affinity for molecular interaction between the hydrocarbon molecules and the mineral molecules.

With the ultimate goal of modeling or simulating future hydrocarbon production from the shale formation, an initial step is determining a value indicative of the kerogen-wet porosity of the shale formation. In accordance with various embodiments, the kerogen-wet porosity may be estimated or calculated based on several underlying parameters. One such parameter is an indication of total organic content (TOC) (i.e., kerogen content) of the shale formation. Many mechanisms exist to obtain an indication of total organic content of the shale formation. For example, by way of exploratory wellbores core samples of the shale formation may be taken, and by way of laboratory analysis the kerogen content may be determined. In some embodiments, not only is the kerogen content determined (e.g., the overall percentage of kerogen of the rock), but also an indication of the different types of and relative concentrations of the different types of kerogen may be determined.

Another parameter that may be used in the overall determination of kerogen-wet porosity is vitrinite reflectivity. In particular, vitrinite is a maceral present in kerogens that has a property that the vitrinite changes color as a function of the maximum temperature to which the vitrinite has been exposed. The "vitrinite reflectivity" thus refers to an indication of the maximum temperature to which the vitrinite (and thus the kerogen) has been exposed over the course of geologic time. Another set of parameters that may be used in the overall determination of kerogen-wet porosity is the burial history for the formation. Burial history for most present day shale formations is available from a variety of sources.

Based on the total organic content (and in some cases the breakdown of kerogen types present), the vitrinite reflectivity, and the burial history, an indication of the kerogen-wet porosity may be calculated. In particular, each kerogen type has a different activation temperature and expulsion rate. Activation temperature refers to the temperature at which the kerogen begins to produce oil and gas, and also to relative amounts of oil and gas produced (as a function of temperature). The expulsion rate is indicative of an amount of oil and gas that has been expelled and has migrated to other formations. For the reason of expulsion, in some cases shale formations are referred to as source reservoir rock—the shale sources hydrocarbons for other rock formations, such as sandstone.

FIG. 1 shows an illustrative set of related graphs showing relative amounts of hydrocarbons expelled and retained for a particular type of kerogen. In particular, the upper graph 100 shows an indication of hydrocarbons retained (Y axis) as a function of maximum temperature to which the kerogen was exposed (X axis), and the lower graph 102 shows an indication of hydrocarbons expelled (Y axis) as a function of maximum temperature to which the kerogen was exposed (X axis).

Referring initially to the lower graph 102, for the particular type of kerogen oil is not expelled until the kerogen reaches about 115 degrees C. At temperatures above about 150 degrees C., the kerogen expels both oil and gas. If an illustrative maximum burial temperature of about 205 degrees C. is reached, the lower graph shows the fraction potential of expelled hydrocarbons is near its maximum. The inventors of the present specification have found that fraction potential of expelled hydrocarbons for kerogen deposits is directly related to porosity. More particularly, the inventors have found when fraction potential of expelled hydrocarbons for a kerogen is very high, the resultant porosity may be high as well, and in some cases as high as 30% depending on the type of kerogen. For the Marcellus and Barnett shales, which for their kerogen types and burial history have reached or almost reached the maximum fraction potential of expelled hydrocarbons, have porosities in the range of about 20-25%.

The upper graph of FIG. 1 illustrative shows the fraction of hydrocarbons retained by the kerogen as a function of maximum temperature. For the illustrative maximum temperature of 205 degrees C., about 2.0% of the hydrocarbons produced over geologic time remain, with more than half of the remaining hydrocarbon in the form of gas. It is the hydrocarbons retained in maturation which are being produced from shale formations present day.

Thus, in order to determine a kerogen-wet porosity, the various embodiments may utilize an indication of the kerogen content, the vitrinite reflectivity, and the burial history. From this information an indication of the fraction potential of expelled hydrocarbons for each kerogen type may be determined. Based on the fraction potential of expelled hydrocarbons for each kerogen type, and in some cases the relative percentages of the kerogen types present in the formation, the kerogen-wet porosity may be determined.

Figure 2:
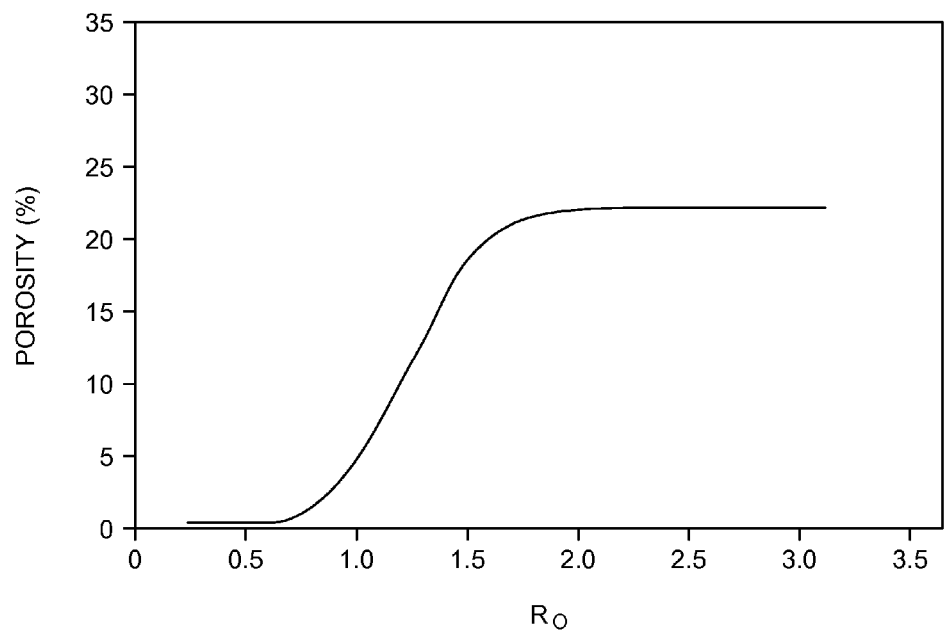
FIG. 2 shows a graph of an illustrative relationship between vitrinite reflectivity (Ro) and porosity, in accordance with at least some embodiments.

FIG. 2 shows a graph of an illustrative relationship between the maturation of the kerogen (expressed as the vitrinite reflectivity Ro, along the X axis) and kerogen-wet porosity (along the Y axis). In particular, the current data of the inventors shows the depicted relationship between vitrinite reflectivity and kerogen-wet porosity, with a steep curve between about 0.75 and 1.75 Ro, asymptotically approaching about 25% for higher values of Ro. Although the inventors do not wish to be tied to any particular physical mechanism that relates expulsion to porosity, one possible correlation deals with volume. That is, as the hydrocarbons are produced and expelled, the volume previously occupied is left unoccupied, thus leading to the porosity. The specification now turns to water-wet porosity.

Water-Wet Porosity

Water-wet porosity refers to porosity associated with water initially deposited along with the organic material, clay material, and other minerals. The water occupies a space in the deposited material that eventually contributes to the present-day porosity of the shale formation. Because of low permeability, in some cases the water may still be present within the water-wet porosity, but in other cases the water may have migrated elsewhere, for example, through fracture permeability caused by natural stresses in the formation. Thus, "water-wet porosity" in this context refers to the creation mechanism of the porosity, not the affinity for molecular interaction between the water molecules and the mineral molecules.

In accordance with at least some embodiments, an indication of the water-wet porosity is obtained. In some cases, the indication of water-wet porosity is determined based on the kerogen-wet porosity, and a total porosity. In particular, the total porosity of the shale formation may be considered, for purposes of this disclosure, to be a combination of the water-wet porosity and the kerogen-wet porosity, according to the following equation:

$$POR_{tot} = POR_{ww} + POR_{ker} \quad (1)$$

where $POR_{tot}$ is the total porosity, $POR_{ww}$ is the water-wet porosity, and $POR_{ker}$ is the kerogen-wet porosity. The $POR_{ker}$ may be determined as discussed above in the section titled KEROGEN-WET POROSITY. The total porosity may be determined from several available sources. For example, Halliburton Energy Services, Inc. of Houston, Tex., provides a SHALELOG® service whereby several parameters of a shale formation are estimated and/or determined, such as total organic content and total porosity. Thus, using the total porosity, the kerogen-wet porosity, and equation (1) above, the water-wet porosity may be determined.

Modeling Flow of Hydrocarbons

Once kerogen-wet porosity and water-wet porosity are known, the flow of hydrocarbons through the formation may be modeled or simulated. The modeling philosophy, however, may be based on several underlying assumptions. Firstly, in addition to the kerogen-wet porosity and water-wet porosity, the shale formations are interlaced with a fracture network caused by geologic stresses, along with artificial fracturing from hydraulic fracture operations (where applicable), singly or collectively referred to as fracture porosity. The fracture network is assumed to have a porosity (i.e., the holes in the rock formation) and permeability (i.e., how well a fluid moves through the porosity present). Secondly, for kerogen particles that do not abut fracture porosity, movement of hydrocarbons from the kerogen-wet porosity to the fracture porosity is assumed to take place through micro-fractures created in the shale during expulsion of hydrocarbons in the distant geologic past. The flow through the kerogen-wet porosity and/or the micro-fractures is non-Darcy flow. While the micro-fractures may have fluidly coupled to water-wet porosity in the past (and thus the water-wet porosity may contain commercially significant amounts of hydrocarbons), very small pore throat size for the micro-fractures (in some cases on the order of 5 nanometers), cementation, and/or diagenesis may make hydrocarbon flow pathways from the kerogen-wet porosity to the fracture porosity separate and apart from hydrocarbon Darcy-flow pathways from water-wet porosity to the fracture porosity. Next, even though the water-wet porosity may contain hydrocarbons, the water-wet porosity may be water-wet (in the affinity sense), and thus the hydrocarbon production mechanism for each system is different than the kerogen-wet porosity, which may produce by diffusion flow. Finally then, in some embodiments the permeability associated with the kerogen-wet porosity is assumed in the modeling to be distinct from the permeability associated with the water-wet porosity.

Figure 3:
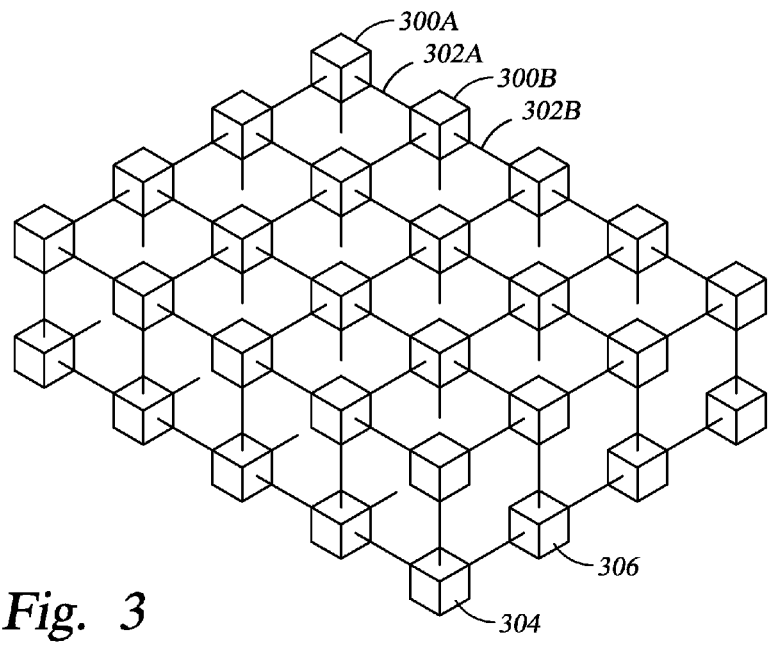
FIG. 3 shows a perspective view of grid structure for modeling or simulating hydrocarbon flow with respect to kerogen particles in accordance with at least some embodiments.

With the underlying assumptions in mind, modeling the flow of hydrocarbons may be based on some or all the various porosities (and related permeabilities) discussed. In some cases, the kerogens are modeled as homogeneous kerogens on a lattice, as shown in FIG. 3. In particular, FIG. 3 illustrative shows a lattice having kerogen particles (e.g., 300A, 300B) interconnected by micro-fractures (e.g., 302A, 302B). While FIG. 3 shows only a two layer lattice so as not to unduly complicate the figure, multiple layers may be used. Moreover, while FIG. 3 illustrates only twenty kerogen particles on each layer (not all the kerogen particles of the second layer are not visible), greater or fewer kerogen particles may be included in the simulation. Thus, a computer system executing a program may simulate hydrocarbon movement from the kerogen particles 300 (oil-wet in an affinity sense, and also having absorbed gas) through the micro-fractures 302 (which may be, in the affinity sense, either oil-wet or water-wet) to the fracture porosity (which fracture porosity is not specifically shown). The spacing and permeability of the fracture porosity may be determined any suitable way, such as core samples, or with respect to areas of the shale formation that have been hydraulically fractured, from software programs that simulate the type and extent of hydraulic fracturing.

Separately modeling the kerogen particles 300 and the micro-fractures 302 enables better predictive qualities for the modeling. That is, hydrocarbons may be produced from the kerogens by different functionalities, and some or all of the functionalities may be modeled. For example, non-absorbed gas may be present in the kerogen-wet porosity, and hydraulic fracturing may open flow pathways from the kerogen particles to the fracture porosity and ultimately to the borehole. Moreover, as the pressure within the kerogen-wet porosity decreases, absorbed gas may be produced. Thus, both these illustrative production mechanisms may be modeled.

The illustration of FIG. 3 is based on homogenous kerogen particles evenly spaced throughout the formation, and micro-fractures 302 fluidly coupling the kerogen particles to their nearest neighbor kerogen particles and eventually to the fracture porosity. However, in other embodiments, the kerogen particles 300 may be separately modeled based on kerogen type. That is, if analysis of the shale formation reveals three different kerogen types, then the model of the formation may likewise comprise three different types of kerogen particles in proportions that substantially match the proportions of the actual kerogen particles of the formation. For example, kerogen particle 304 may be modeled as a Type II kerogen, whereas kerogen particle 306 may be a Type III/IV kerogen, each kerogen type having a different internal porosity and different retained hydrocarbon types and volumes. Though one may know the different types of kerogens in a shale formation based on the various types of analysis, the precise layout of the different kerogen types may not be known, and thus a random distribution of the kerogen types through the lattice may be used.

Further still, the arrangement of the kerogen particles need not be regular as shown in FIG. 3. In particular, the layout of the kerogen particles (whether homogenous or comprising different, randomly selected types) in the model volume may be irregularly spaced within the lattice. For example, a shale formation with relatively low total organic content may be modeled as a model volume with irregularly spaced kerogen particles, to better simulate the hydrocarbon flow characteristics.

In some embodiments, the hydrocarbon flow pathways associated with the kerogen-wet porosity and related micro-fractures (non-Darcy flow) are assumed to be separate and distinct flow pathways from the water-wet porosity (Darcy flow), and that the separate flow pathways do not intermingle. Thus, until the hydrocarbons reach the fracture porosity, the flow through each system is separate. For these reasons, in some embodiments the two distinct systems are separately modeled for the same model volume. FIG. 3 does not show the water-wet porosity so as not to unduly complicate the figure, but one having ordinary skill in the art now understanding the modeling of flow associated with the kerogen-wet porosity, could implement modeling of flow associated with the parallel water-wet porosity (e.g., water-wet in an affinity sense, no absorption) using knowledge of Darcy flow modeling techniques. Thus, there four continua that may be explicitly modeled in accordance with at least some embodiments: kerogen-wet porosity (oil-wet in the affinity sense, containing absorbed gas); micro-fractures (that may be either oil-wet or water-wet in the affinity sense); water-wet porosity (water-wet in the affinity sense, and with no absorption); and fracture porosity. In some embodiments, only the four continua are modeled.

Figure 4:
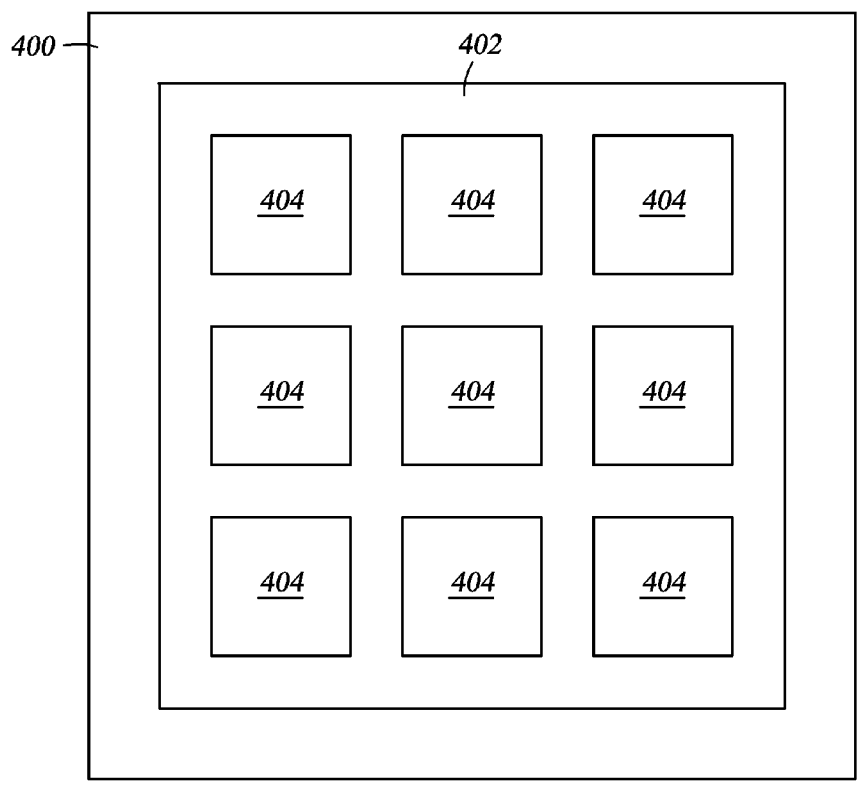
FIG. 4 shows a block diagram of modeling or simulating fracture porosity, kerogen-wet porosity, and water-wet porosity in accordance with at least some embodiments.

FIG. 4 shows a block diagram structure to illustrate gridding the explicitly modeling continua. In particular, FIG. 4 illustrates the fracture porosity and/or permeability (hereafter just fracture porosity 400) by way of the outer portion of the block diagram. That is, fracture porosity 400 may be thought of as surrounding or encompassing the other components expressly modeled. The fracture porosity may be water- or oil-wet in affinity sense, and in most cases has high permeability. Bounded within the fracture porosity 400 is the kerogen-wet porosity and/or permeability (hereafter just kerogen-wet porosity 402). The contiguous portions associated with kerogen-wet porosity 402 represent flow pathways through the kerogen-wet porosity and/or the micro-fractures (not specifically shown). Again, the kerogen-wet porosity 402 is in most cases oil-wet in an affinity sense, gas filled, and comprises absorbed gas in the pores of the kerogen. Finally, bounded within the fracture porosity 400 is the water-wet porosity and/or permeability (hereafter just water-wet porosity 404). While shown as bounded exclusively by the kerogen-wet porosity 402, the water-wet porosity 404 may likewise abut both kerogen-wet porosity 402 and the fracture porosity 400. The portions associated with water-wet porosity 404 represent flow pathways through the water-wet porosity. Again, the water-wet porosity 404 is in most cases water-wet in an affinity sense, may be gas filled, and has Darcy flow.

The kerogen-wet porosity may have non-absorbed gas (which is produced through the kerogen particles and micro-fractures), but the kerogen-wet porosity may also have absorbed gas within the kerogen particle structure. Thus, in at least some embodiments, modeling or simulating gas produced from the kerogen-wet porosity takes into account not only the non-absorbed gas, but also absorbed gas freed by decreasing pore pressure. The phenomenon is characterized by the Langmuir Equation (also known as the Langmuir Isotherms).

Given a computing system with sufficient computing functionality, an entire shale formation may be modeled using the parallel kerogen-wet and water-wet systems described above. From the model, the expected hydrocarbon production at one or more boreholes drilled within the shale formation may be estimated. However, the time associated with running a formation-scale model that models both the non-Darcy hydrocarbon flow through the kerogen-wet porosity and related micro-fractures, and also models the Darcy flow through water-wet porosity, may be prohibitively long and/or prohibitively expensive from a computer use standpoint. Thus, the inventors of the present specification have developed a hybrid system, which hybrid system builds on the discoveries regarding determining kerogen-wet porosity and modeling kerogen-wet porosity.

The inventors of the present specification have determined that one shortcoming in modifying existing formation modeling tools to accurately predict future hydrocarbon production from shale formations is the number of variables which need be determined. In particular, existing formation modeling tools abstract the formation (i.e., represent the formation) as a combination of at least: fracture porosity and related permeability; a "matrix" porosity and permeability that represent the formation itself; and transfer functions that are indicative of the movement of hydrocarbons between the matrix porosity and the fracture porosity. However, the existing formation modeling tools were created for formations having porosity 500 times greater than most shale formations, and so attempting to use existing formation modeling tools to model shale formations has been thwarted by the difficulties in selecting parameters for the various porosities, permeabilities, and transfer functions.

To address the issue of the cost and/or time investment in computer systems to implement formation-wide models using at least the kerogen-wet porosity, and/or to address issues regarding use of existing formation modeling tools not directly suited for modeling of shale formations, the inventors have devised a hybrid system whereby initial modeling is performed using the kerogen-wet and water-wet porosities on one or more small model volumes (e.g., one square centimeter) to determine how the hydrocarbons move through the porosities to the fracture porosity. From the simulation regarding the small model volume, porosities and permeabilities to be used on the large scale formation model may be determined. In particular, based on the small model volumes, a matrix porosity and matrix permeability may be determined, where the matrix porosity and permeability are determined based on contributions from both the kerogen-wet porosity (along with the micro-fractures) and the water-wet porosity. Based on the values determined, formation-scale simulations may be run with the determined parameters.

Further still, in addition to or in place of calculating matrix porosity and matrix permeability, the small model volume may be used to calculate a value indicative of movement of hydrocarbons from the kerogen-wet porosity to the fracture porosity. Similarly, the small model volume may be used to calculate a value indicative of movement of hydrocarbons from the water-wet porosity to the fracture porosity. The values indicative movement (sometimes referred to as transfer functions), along with the matrix porosity and permeability determined from the small model volume, may be used to estimate future hydrocarbon flow from the shale formation.

So as not to unduly complicate the discussion, the specification to this point has assumed that the flow pathways between the kerogen-wet porosity and water-wet porosity are separate and distinct—no movement between the systems. However, in yet still further embodiments, hydrocarbon flow between the kerogen-wet porosity and water-wet porosity may take place, particularly in the zones closest to the borehole (and thus closest to the fracture pressure source). Thus, in accordance with yet still further embodiments, in addition to the various flow regimes within a porosity system, the simulations or models may assume hydrocarbon flow between the kerogen-wet porosity and water-wet porosity. Based micro-fracture pore throat size, and/or the absorbed gas tending to hold the gas pressure in the kerogen particles when the gas has depleted from the water-wet porosity (with no or little absorption), most if not all hydrocarbon flow will be from the kerogen-wet porosity to the water-wet porosity, but reverse flow is certainly possible.

Figure 5:
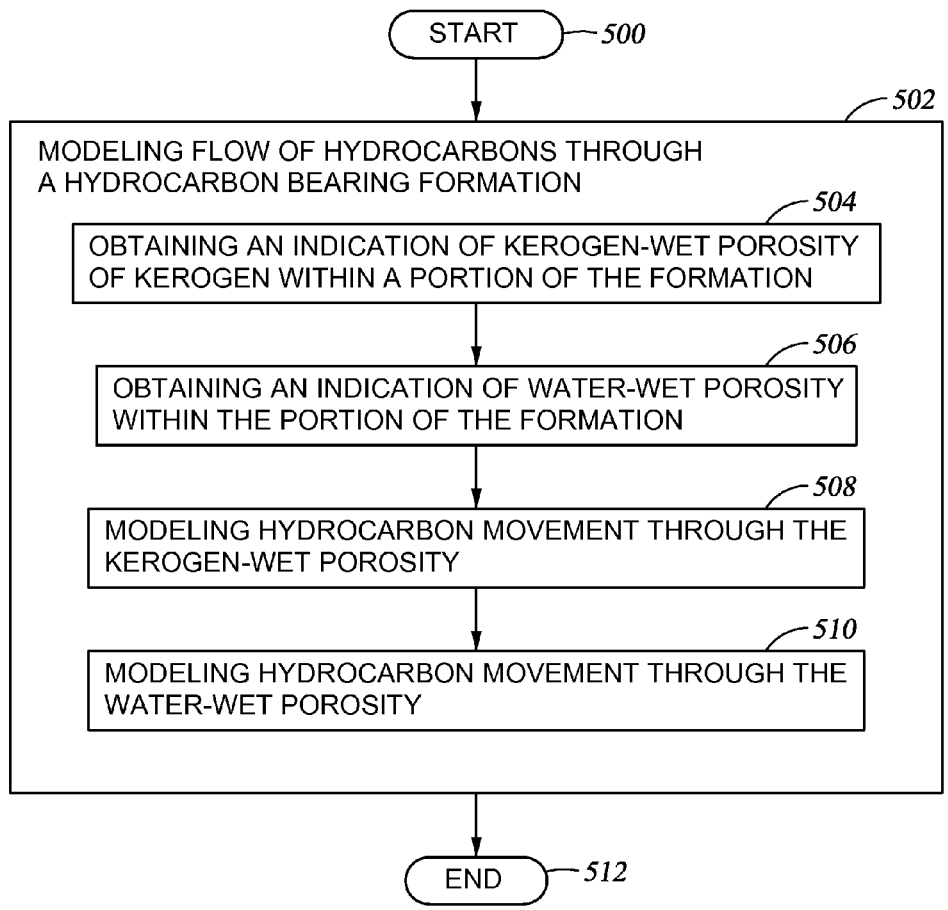
FIG. 5 shows a method in accordance with at least some embodiments.

FIG. 5 shows a method in accordance with at least some embodiments. In particular, the method starts (block 500) and proceeds to modeling flow of hydrocarbons through a hydrocarbon bearing formation (block 502). In some embodiments, the modeling (again block 502) may be by: obtaining an indication of kerogen-wet porosity of kerogen within a portion of the formation (block 504); obtaining an indication of water-wet porosity within the portion of the formation (block 506); modeling hydrocarbon movement through the kerogen-wet porosity (block 508); and modeling hydrocarbon movement through the water-wet porosity (block 510). Thereafter, the method may end (block 512), possibly to be restarted with different parameters, or regarding a different modeled volume. In many cases, the illustrative method is performed by a program executing on a computer system.

Figure 6:
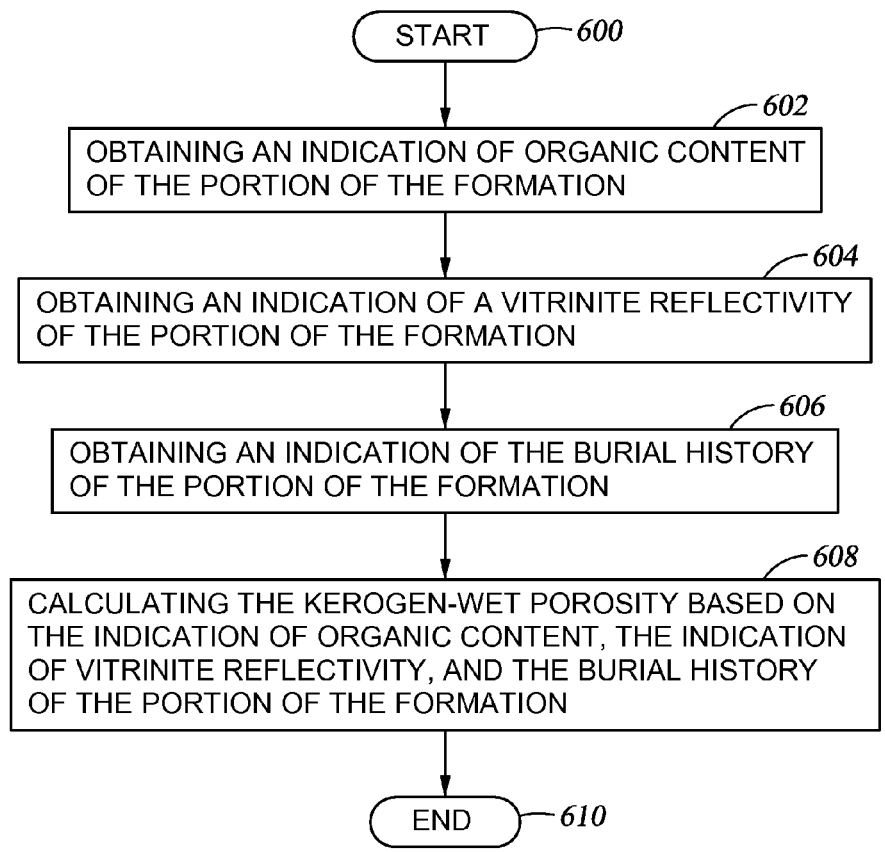
FIG. 6 shows a method in accordance with at least some embodiments.

FIG. 6 shows a method of obtaining an indication of the kerogen-wet porosity. In particular, the method starts (block 600) and comprises: obtaining an indication of organic content of the portion of the formation (block 602); obtaining an indication of a vitrinite reflectivity of the portion of the formation (block 604); obtaining an indication of the burial history of the portion of the formation (block 606); and calculating the kerogen-wet porosity based on the indication of organic content, the indication of vitrinite reflectivity, and the burial history of the portion of the formation (block 608). Thereafter, the method ends (block 610), possibly to be restarted for a different kerogen type and/or different portion of the formation. In many cases, the illustrative method is performed by a program executing on a computer system.

Figure 7:
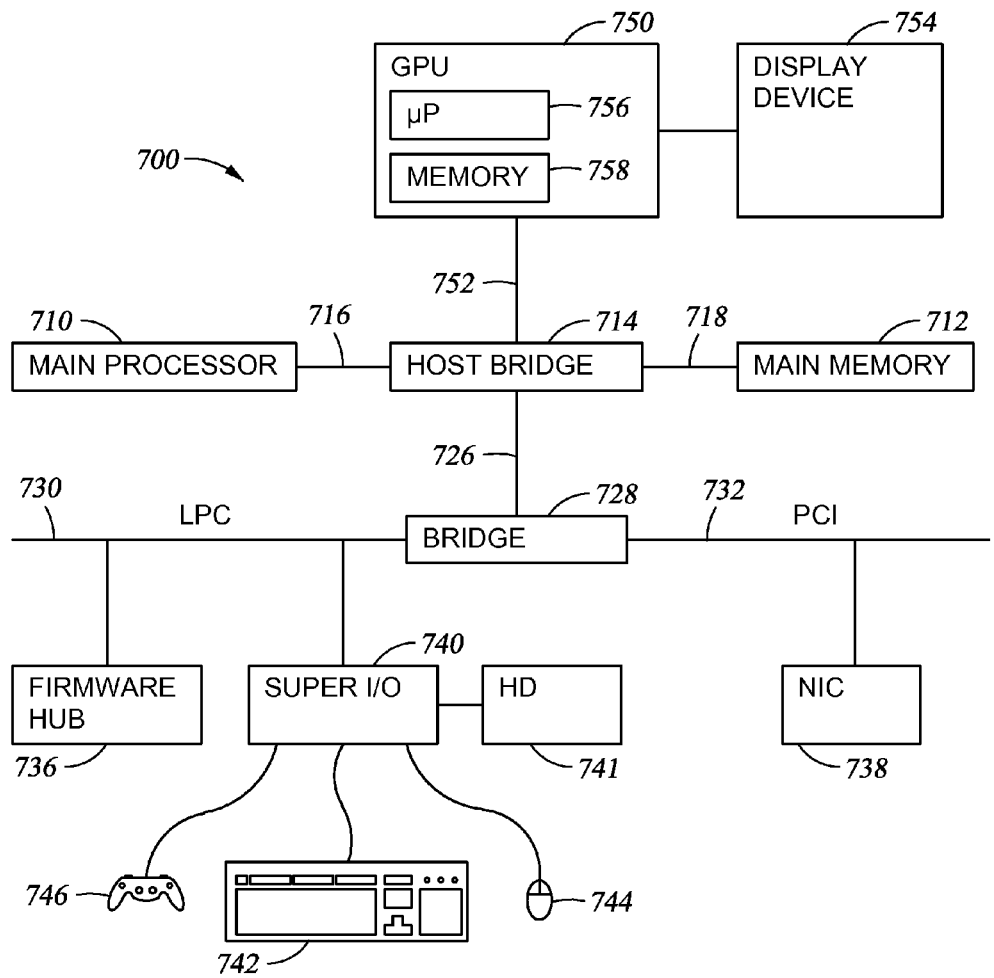
FIG. 7 shows a computer system in accordance with at least some embodiments.

FIG. 7 illustrates a computer system 700 in accordance with at least some embodiments. In particular, computer system 700 comprises a main processor 710 coupled to a main memory array 712, and various other peripheral computer system components, through integrated host bridge 714. The main processor 710 may be a single processor core device, or a processor implementing multiple processor cores. Furthermore, computer system 700 may implement multiple main processors 710. The main processor 710 couples to the host bridge 714 by way of a host bus 716, or the host bridge 714 may be integrated into the main processor 710. Thus, the computer system 700 may implement other bus configurations or bus-bridges in addition to, or in place of, those shown in FIG. 7.

The main memory 712 couples to the host bridge 714 through a memory bus 718. Thus, the host bridge 714 comprises a memory control unit that controls transactions to the main memory 712 by asserting control signals for memory accesses. In other embodiments, the main processor 710 directly implements a memory control unit, and the main memory 712 may couple directly to the main processor 710. The main memory 712 functions as the working memory for the main processor 710 and comprises a memory device or array of memory devices in which programs, instructions and data are stored. The main memory 712 may comprise any suitable type of memory such as dynamic random access memory (DRAM) or any of the various types of DRAM devices such as synchronous DRAM (SDRAM), extended data output DRAM (EDODRAM), or Rambus DRAM (RDRAM). The main memory 712 is an example of a non-transitory computer-readable medium storing programs and instructions, and other examples are disk drives and flash memory devices.

The illustrative computer system 700 also comprises a second bridge 728 that bridges the primary expansion bus 726 to various secondary expansion buses, such as a low pin count (LPC) bus 730 and peripheral components interconnect (PCI) bus 732. Various other secondary expansion buses may be supported by the bridge device 728. In accordance with some embodiments, the bridge device 728 comprises an Input/Output Controller Hub (ICH) manufactured by Intel Corporation, and thus the primary expansion bus 726 comprises a Hub-link bus, which is a proprietary bus of the Intel Corporation. However, computer system 700 is not limited to any particular chip set manufacturer, and thus bridge devices and expansion bus protocols from other manufacturers may be equivalently used.

Firmware hub 736 couples to the bridge device 728 by way of the LPC bus 730. The firmware hub 736 comprises read-only memory (ROM) which contains software programs executable by the main processor 710. The software programs comprise programs executed during and just after power on self tests (POST) procedures as well as memory reference code. The POST procedures and memory reference code perform various functions within the computer system before control of the computer system is turned over to the operating system.

The computer system 700 further comprises a network interface card (NIC) 738 illustratively coupled to the PCI bus 732. The NIC 738 acts as to couple the computer system 700 to a communication network, such the Internet.

Still referring to FIG. 7, computer system 700 may further comprise a super input/output (I/O) controller 740 coupled to the bridge 728 by way of the LPC bus 730. The Super I/O controller 740 controls many computer system functions, for example interfacing with various input and output devices such as a keyboard 742, a pointing device 744 (e.g., mouse), game controller 746, various serial ports, floppy drives and disk drives. The super I/O controller 740 is often referred to as "super" because of the many I/O functions it performs.

The computer system 700 further comprises a graphics processing unit (GPU) 750 coupled to the host bridge 714 by way of bus 752, such as a PCI Express (PCI-E) bus or Advanced Graphics Processing (AGP) bus. Other bus systems, including after-developed bus systems, may be equivalently used. Moreover, the graphics processing unit 750 may alternatively couple to the primary expansion bus 726, or one of the secondary expansion buses (e.g., PCI bus 732). The graphics processing unit 750 couples to a display device 754 which may comprise any suitable electronic display device upon which any image or text can be displayed. The graphics processing unit 750 comprises an onboard processor 756, as well as onboard memory 758. The processor 756 may thus perform graphics processing, as commanded by the main processor 710. Moreover, the memory 758 may be significant, on the order of several hundred megabytes or more. Thus, once commanded by the main processor 710, the graphics processing unit 750 may perform significant calculations regarding graphics to be displayed on the display device, and ultimately display such graphics, without further input or assistance of the main processor 710.

Thus, it is upon illustrative computer system 700 that the various modeling and simulations discussed above may be performed. Moreover, the modeling and/or simulation may be performed by a host of computer systems, such as computer system 700, operated in a parallel fashion. The results of the modeling and/or simulation may be shown the display device 754, and manipulated and/or explored by any of the user interface devices.

It is noted that while theoretically possible to perform some or all the calculations, simulations, and/or modeling by a human using only pencil and paper, the time measurements for human-based performance of such tasks may range from man-days to man-years, if no more. Thus, this paragraph shall serve as support for any claim limitation now existing, or later added, setting forth that the period of time to perform any task described herein less than the time required to perform the task by hand, less than half the time to perform the task by hand, and less than one quarter of the time to perform the task by hand, where "by hand" shall refer to performing the work using exclusively pencil and paper.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments, and/or to create a non-transitory computer-readable storage medium (i.e., other than an signal traveling along a conductor or carrier wave) for storing a software program to implement the method aspects of the various embodiments.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer-implemented method of modeling hydrocarbon flow through a hydrocarbon bearing formation, the method comprising:
   determining, by a computer system, a kerogen-wet porosity within a portion of a reservoir rock formation, based on one or more formation parameters associated with the portion of the reservoir rock formation;
   determining, by the computer system, a water-wet porosity within the portion of the reservoir rock formation, based in part on the kerogen-wet porosity;
   simulating, by the computer system, hydrocarbon movement through a first small model volume representing the kerogen-wet porosity within the portion of the reservoir rock formation;
   simulating, by the computer system, hydrocarbon movement through a second small model volume representing the water-wet porosity within the portion of the reservoir rock formation;
   determining a matrix porosity and permeability for the portion of the reservoir rock formation, based on the simulated hydrocarbon movement through the respective first and second small model volumes;
   simulating, by the computer system, hydrocarbon movement through a large scale formation model of the reservoir rock formation, based on the matrix porosity and permeability determined for the portion of the reservoir rock formation; and
   estimating, by the computer system, future hydrocarbon production for drilling one or more boreholes within the reservoir rock formation, based on the simulated hydrocarbon movement through the large scale formation model.

2. The method of claim 1, wherein the first small model volume also represents micro-fractures connecting the kerogen-wet porosity to a fracture porosity of the portion of the reservoir rock formation, and simulating hydrocarbon movement through the first small model volume comprises simulating a flow of hydrocarbons from the kerogen wet porosity through the micro-fractures into the fracture porosity.

3. The method of claim 1, wherein determining the kerogen-wet porosity further comprises:
   determining a total organic content of the portion of the reservoir rock formation;
   determining a vitrinite reflectivity of the portion of the reservoir rock formation;
   determining a burial history of the portion of the reservoir rock formation; and
   calculating, by the computer system, the kerogen-wet porosity based on the total organic content, the vitrinite reflectivity, and the burial history of the portion of the reservoir rock formation.

4. The method of claim 3, wherein determining the water-wet porosity further comprises:
   determining a total porosity of the portion of the reservoir rock formation, based on an analysis of a core sample obtained for the portion of the reservoir rock formation; and
   calculating, by the computer system, the water-wet porosity based on the total porosity relative to the kerogen-wet porosity.

5. The method of claim 2, wherein the micro-fractures connecting the kerogen-wet porosity within the portion of the reservoir rock formation are oil-wet or water-wet.

6. The method of claim 2, wherein simulating hydrocarbon movement through the first small model volume further comprises calculating, by the computer system, a first value indicative of the hydrocarbon movement from the kerogen-wet porosity through the micro-fractures to the fracture porosity of the portion of the reservoir rock formation.

7. The method of claim 6, wherein simulating hydrocarbon movement through the second small model volume further comprises calculating, by the computer system, a second value indicative of the hydrocarbon movement from the water-wet porosity to the fracture porosity.

8. The method of claim 7, wherein the hydrocarbon movement through the large scale formation model is simulated based on the matrix porosity and permeability determined for the portion of the reservoir rock formation along with the first and second values calculated for the portion of the reservoir rock formation.

9. A computer system comprising:
   a processor;
   a memory coupled to the processor; and
   a display device coupled to the processor;
   wherein the memory stores a program that, when executed by the processor, causes the processor to:
      determine a kerogen-wet porosity within a portion of a hydrocarbon bearing formation, based on one or more formation parameters associated with the portion of the hydrocarbon bearing formation;
      determine a water-wet porosity within the portion of the hydrocarbon bearing formation, based in part on the kerogen-wet porosity;
      simulate hydrocarbon movement through a first small model volume representing the kerogen-wet porosity within the portion of the hydrocarbon bearing formation;
      simulate hydrocarbon movement through a second small model volume representing the water-wet porosity within the portion of the hydrocarbon bearing formation;
      determine a matrix porosity and permeability for the portion of the hydrocarbon bearing formation, based on the simulated hydrocarbon movement through the respective first and second small model volumes;
      simulate hydrocarbon movement through a large scale formation model of the hydrocarbon bearing formation, based on the matrix porosity and permeability determined for the portion of the hydrocarbon bearing formation; and
      estimate future hydrocarbon production for drilling one or more boreholes within the hydrocarbon bearing formation, based on the simulated hydrocarbon movement through the large scale formation model.

10. The computer system of claim 9, wherein the program further causes the processor to:
   determine a total organic content of the portion of the hydrocarbon bearing formation;
   determine a vitrinite reflectivity of the portion of the hydrocarbon bearing formation;

determine a burial history of the portion of the hydrocarbon bearing formation; and calculate the kerogen-wet porosity based on the total organic content, the vitrinite reflectivity, and the burial history of the portion of the hydrocarbon bearing formation.

11. The computer system of claim 10, wherein the program further causes the processor to:

determine a total porosity of the portion of the hydrocarbon bearing formation, based on an analysis of a core sample obtained for the portion of the hydrocarbon bearing formation; and calculate the water-wet porosity based on the total porosity relative to the kerogen-wet porosity.

12. The computer system of claim 9, wherein the first small model volume also represents micro-fractures connecting the kerogen-wet porosity to a fracture porosity of the portion of the hydrocarbon bearing formation, and the processor simulates hydrocarbon movement through the first small model volume by simulating a flow of hydrocarbons from the kerogen-wet porosity through the micro-fractures into the fracture porosity.

13. The computer system of claim 12, wherein the micro-fractures connecting the kerogen-wet porosity within the portion of the hydrocarbon bearing formation are oil-wet or water-wet.

14. The computer system of claim 12, wherein the program further causes the processor to:

calculate a value indicative of the hydrocarbon movement from the kerogen-wet porosity through the micro-fractures to the fracture porosity, based on the first small model volume.

15. The computer system of claim 12, wherein the program further causes the processor to:

calculate a value indicative of the hydrocarbon movement from the water-wet porosity to the fracture porosity, based on the second small model volume.

16. A non-transitory computer-readable medium storing a program that, when executed by a processor, causes the processor to:

determine a kerogen-wet porosity within a portion of a hydrocarbon bearing formation, based on one or more formation parameters associated with the portion of the hydrocarbon bearing formation;

determine a water-wet porosity within the portion of the hydrocarbon bearing formation, based in part on the kerogen-wet porosity;

simulate hydrocarbon movement through a first small model volume representing the kerogen-wet porosity within the portion of the hydrocarbon bearing formation;

simulate hydrocarbon movement through a second small model volume representing the water-wet porosity within the portion of the hydrocarbon bearing formation;

determine a matrix porosity and permeability for the portion of the hydrocarbon bearing formation, based on the simulated hydrocarbon movement through the respective first and second small model volumes;

simulate hydrocarbon movement through a large scale formation model of the hydrocarbon bearing formation, based on the matrix porosity and permeability determined for the portion of the hydrocarbon bearing formation; and estimate future hydrocarbon production for drilling one or more boreholes within the hydrocarbon bearing formation, based on the simulated hydrocarbon movement through the large scale formation model.

17. The non-transitory computer-readable of claim 16, wherein the program further causes the processor to:

determine a total organic content of the portion of the hydrocarbon bearing formation;

determine a vitrinite reflectivity of the portion of the hydrocarbon bearing formation;

determine a burial history of the portion of the hydrocarbon bearing formation; and calculate the kerogen-wet porosity based on the total organic content, the vitrinite reflectivity, and the burial history of the portion of the hydrocarbon bearing formation.

18. The non-transitory computer-readable of claim 16, wherein the program further causes the processor to:

determine a total porosity of the portion of the hydrocarbon bearing formation, based on an analysis of a core sample obtained for the portion of the hydrocarbon bearing formation; and calculate the water-wet porosity based on the total porosity relative to the kerogen-wet porosity.

19. The non-transitory computer-readable of claim 16, wherein the first small model volume also represents micro-fractures connecting the kerogen-wet porosity to a fracture porosity of the portion of the hydrocarbon bearing formation, and the processor simulates hydrocarbon movement through the first small model volume by simulating a flow of hydrocarbons from the kerogen-wet porosity through the micro-fractures into the fracture porosity.

20. The non-transitory computer-readable of claim 19, wherein the program further causes the processor to:

calculate a value indicative of the hydrocarbon movement from the kerogen-wet porosity through the micro-fractures to the fracture porosity, based on the first small model volume.

21. The non-transitory computer-readable of claim 19, wherein the program further causes the processor to:

calculate a value indicative of the hydrocarbon movement from the water-wet porosity to the fracture porosity, based on the second small model volume.

* * * * *